US012729273B2

(12) United States Patent
Nam et al.

(10) Patent No.: US 12,729,273 B2
(45) Date of Patent: Sep. 8, 2026

(54) POROUS FILM WITH LOW DIELECTRIC PROPERTY AND MANUFACTURING METHOD THEREOF

(71) Applicant: KYUNGPOOK NATIONAL UNIVERSITY INDUSTRY-ACADEMIC COOPERATION FOUNDATION, Daegu (KR)

(72) Inventors: Ki-Ho Nam, Daegu (KR); Seongjun Khim, Gimhae-si (KR); Yun Chan Hwang, Geoje-si (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 496 days.

(21) Appl. No.: 18/238,314

(22) Filed: Aug. 25, 2023

(65) Prior Publication Data

US 2025/0026887 A1 Jan. 23, 2025

(30) Foreign Application Priority Data

Jul. 17, 2023 (KR) ........................ 10-2023-0092303

(51) Int. Cl.

| | |
|---|---|
| ***C08G 73/10*** | (2006.01) |
| ***C08J 5/18*** | (2006.01) |
| ***C08J 9/00*** | (2006.01) |
| ***C08J 9/28*** | (2006.01) |

(Continued)

(52) U.S. Cl.

CPC ..... *C08G 73/1067* (2013.01); *C08G 73/1032* (2013.01); *C08J 5/18* (2013.01); *C08J 9/0066* (2013.01); *C08J 9/286* (2013.01); *C08K 9/02* (2013.01); *H05K 9/0081* (2013.01);

(Continued)

(58) Field of Classification Search

CPC ............ C08G 73/1067; C08G 73/1032; C08G 73/105; C08G 73/1071; C08J 5/18; C08J 9/0066; C08J 9/286; C08J 2201/0502; C08J 2205/044; C08J 2379/08; C08J 9/26; C08K 9/02; C08K 3/013; C08K 3/34;

(Continued)

(56) References Cited

FOREIGN PATENT DOCUMENTS

| | | | | |
|---|---|---|---|---|
| CN | 110845731 A | * | 2/2020 | ............. B01D 71/64 |
| JP | 2001-151929 A | | 6/2001 | |
| JP | 2011219585 A | * | 11/2011 | |

(Continued)

OTHER PUBLICATIONS

Korean Office Action for related KR Application No. 10-2023-0092303 mailed Aug. 27, 2025 from Korean Intellectual Property Office.

*Primary Examiner* — K. Boyle
(74) *Attorney, Agent, or Firm* — Paratus Law Group, PLLC

(57) ABSTRACT

A manufacturing method of a porous polyimide film, includes: preparing a polyamic acid solution at a concentration of 10 to 30 wt % by dissolving a diamine compound and a dianhydride in a solvent; applying the prepared polyamic acid solution to a substrate to prepare a film and then immersing the same in a non-solvent for 30 minutes to 180 minutes; and taking out the immersed film and thermally curing the same; and a porous polyimide film manufactured thereby.

15 Claims, 9 Drawing Sheets

(51) Int. Cl.
*C08K 9/02* (2006.01)
*H05K 9/00* (2006.01)

(52) U.S. Cl.
CPC .. *C08J 2201/0502* (2013.01); *C08J 2205/044* (2013.01); *C08J 2379/08* (2013.01)

(58) Field of Classification Search
CPC .......... C08K 3/36; C08K 7/26; H05K 9/0081; C08L 73/08; C08L 79/08
See application file for complete search history.

(56) References Cited

FOREIGN PATENT DOCUMENTS

| | | | | |
|---|---|---|---|---|
| JP | 2012-167181 A | | 9/2012 | |
| KR | 10-0428875 B1 | | 4/2004 | |
| KR | 102154549 B1 | * | 9/2020 | ......... B01D 67/0095 |

* cited by examiner

PPI

No measurable
pore size distribution a
Dielectric Constant
1.9
1.8
1.7
1.6
$10^2$
$10^3$
$10^4$
$10^5$
$10^6$
Frequency (Hz)
−20 °C
25 °C
50 °C
100 °C
150 °C
200 °C
b
Dissipation Factor
0.09
0.06
0.03
0.00
$10^2$
$10^3$
$10^4$
$10^5$
$10^6$
Frequency (Hz)
−20 °C
25 °C
50 °C
100 °C
150 °C
200 °C

POROUS FILM WITH LOW DIELECTRIC PROPERTY AND MANUFACTURING METHOD THEREOF

CROSS-REFERENCE TO PRIOR APPLICATION

This application claims priority to Korean Patent Application No. 10-2023-0092303 (filed on Jul. 17, 2023), which is hereby incorporated by reference in its entirety.

BACKGROUND

The present invention relates to a porous film with low dielectric property and a manufacturing method thereof, and more particularly, to a porous polyimide film having a dielectric constant and dielectric loss property that have been significantly lowered through a thermodynamic phase separation process and a manufacturing method thereof.

With the beginning of an era of hyper-connected intelligence, characterized by artificial intelligence, big data, self-driving vehicles, remote medical treatment, and so on, the development and distribution of various electronic devices such as smartphones have been accelerated. Accordingly, the 5th generation (5G) mobile communication system, which is capable of wireless high-speed and large-capacity data transmission, is rapidly gaining importance. The 5G communication has great advantages in terms of speed, capacity, and simultaneous access to multiple terminals in high-frequency bands (Sub-6 and 28 GHz bands), but due to the short range of the radio signals in high-frequency bands, many base station antennas should be densely established. Above all, the quality of communication circuits including antennas is also very important to perform high-speed signal processing while minimizing signal delay.

The main components of communication circuits are a polymer dielectric substrate, an adhesive, and a conductive copper film. As the previous communication method changes to next-generation 5G communication, communication circuits also need to be improved to minimize signal loss or delay for 5G high-frequency signals. With regard to the dielectric substrates used in high-frequency bands for 5G communication, above all else, the dielectric constant ($D_k$) and dielectric loss ($D_f$) must be low to minimize the radio loss. Therefore, polyimide (PI), which was mainly used for the conventional long term evolution (LTE) communication, is difficult to use ($D_k$=~3.5 at 1 KHz). In particular, as the frequency of the radio signal increases, a skin effect occurs in which the transmission signal flows along the circuit surface, resulting in signal delay or loss. Therefore, it is of great importance that the copper film should be designed to be thin and to have a low surface roughness in order to prevent the skin effect and allow for high-speed data transmission. In addition, it is necessary to develop a manufacturing technology that is easy to manufacture a high-density, narrow-pitch circuit and that can minimize the discharge of waste liquids from etching or minimize the process steps, securing eco-friendliness, economic feasibility, and mass production.

Therefore, to preoccupy the future communication market, it is critical to develop a next-generation ultra-low dielectric constant material having low dielectric loss in the millimeter wave (mmWave) band around 28 GHZ, which is the ultimate high-frequency region of next-generation communication, and having excellent absorption resistance, high adhesion to ultra-thin copper film, and high heat resistance and processability for adhesion and multilayer lamination.

Patent Document 1: Korean Patent Publication No. 10-0428875 (published on Apr. 29, 2004)

SUMMARY

The purpose of the present invention is to provide a porous polyimide film having a low dielectric constant and low dielectric loss property, a manufacturing method thereof, and a use thereof.

In order to achieve the purpose above, the present invention provides a manufacturing method of a porous polyimide film, the method comprising: preparing a polyamic acid solution at a concentration of 10 to 30 wt % by dissolving a diamine compound and a dianhydride in a solvent; applying the prepared polyamic acid solution to a substrate to prepare a film and then immersing the same in a non-solvent for 30 minutes to 180 minutes; and taking out the immersed film and thermally curing the same.

In the manufacturing method, the concentration of the polyamic acid solution may be controlled to control the pore shape or the pore size of a polyimide film.

In the manufacturing method, the time of immersing in the non-solvent may be controlled to control the pore shape or the pore size of a polyimide film.

The manufacturing method may further comprise preparing a surface-modified porous inorganic filler before preparing a polyamic acid solution, wherein the prepared porous inorganic filler may be added to the polyamic acid solution prepared by dissolving a diamine compound and a dianhydride in a solvent.

The present invention provides a method for preparing a porous polyimide film, the method comprising: preparing a surface-modified porous inorganic filler; preparing a polyamic acid solution by dissolving a diamine compound and a dianhydride in a solvent and adding the surface-modified porous inorganic filler to the prepared solution; applying the polyamic acid solution to which the surface-modified porous inorganic filler is added to a substrate to prepare a film and then immersing the same in a non-solvent; and taking out the immersed film and thermally curing the same.

The porous inorganic filler may be surface-modified with at least one selected from the group consisting of $NH_2$, OH, and SH.

The porous inorganic filler may be selected from the group consisting of mesoporous silica of MCM-41 or MCM-48; polyhedral oligomeric silsesquioxane (POSS); and zeolite of zeolite X or zeolite Y.

The porous inorganic filler may be included in an amount of 1 to 20 parts by weight based on a total of 100 parts by weight of the polyamic acid solution.

The polyamic acid solution may have a concentration of 10 to 30 wt %.

The immersing in a non-solvent may be performed for 30 to 180 minutes.

The present invention provides a porous polyimide film prepared according to the method.

The polyimide film may have pores having an average diameter of 10 to 30 μm.

The polyimide film may form a hierarchical porous structure to have low dielectric property.

The polyimide film may have improved thermal stability.

In addition, the present invention provides an insulating material for high frequency, comprising the porous polyimide film.

According to the manufacturing method of a porous polyimide film according to the present invention, parameters such as concentration of a polymer solution and immersion time may be controlled to prepare a film having a controlled pore shape and/or pore size.

Since the performance of a polyimide film is closely related to the morphological structure, a hierarchical porous structure may be formed and a porous polyimide film having better low dielectric property can be manufactured according to the manufacturing method.

In addition, the porous polyimide film prepared according to the present invention may be used as an insulating material for high frequency or a battery separator, and furthermore, various types of porous polymer materials can be used to provide an insulating material or a battery separator having excellent performance through pore control according to the need.

DETAILED DESCRIPTION

Figure 1:
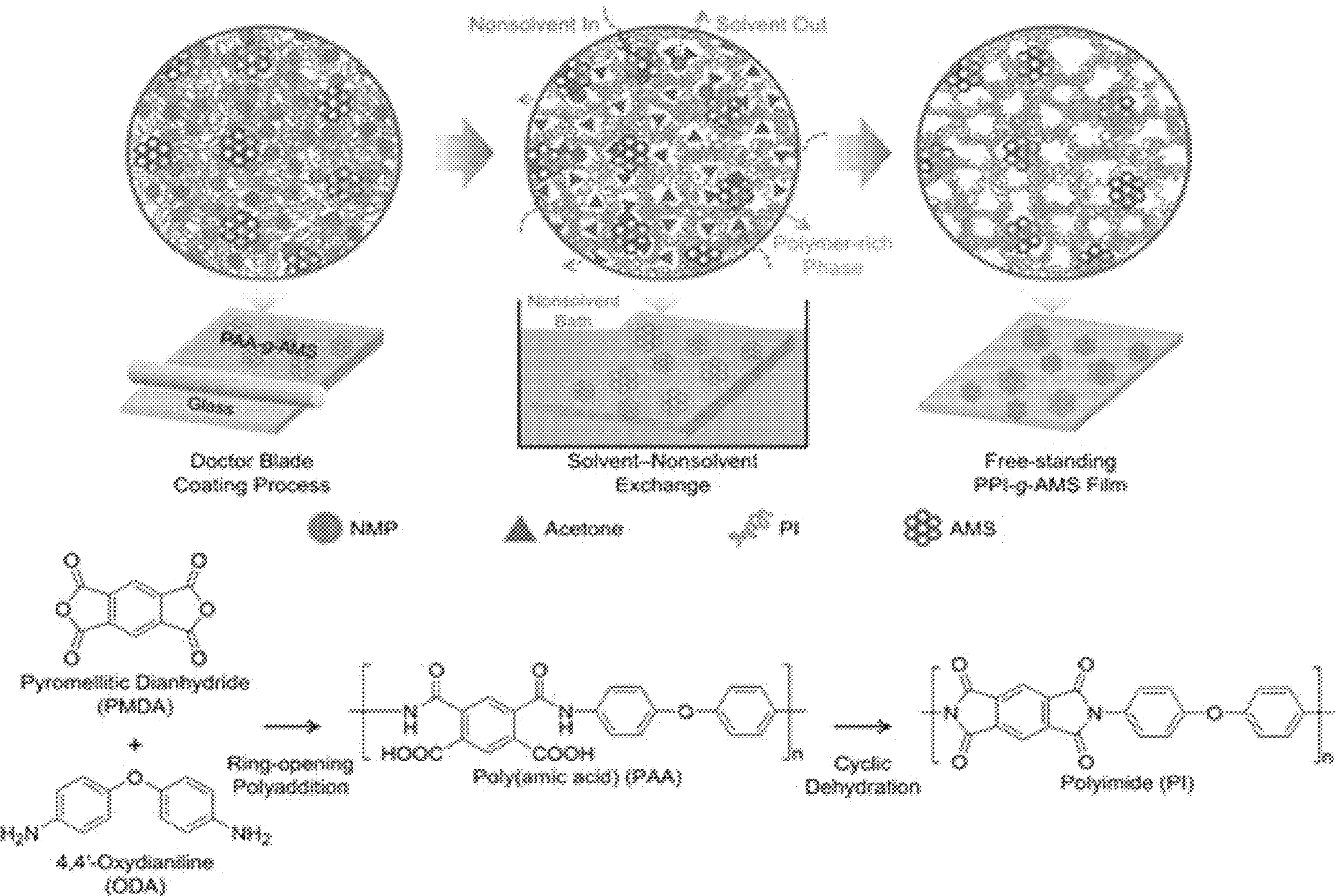
FIG. 1 is a schematic illustration of a manufacturing process of a porous polyimide (PPI) film manufactured according to one embodiment of the present invention.

Hereinafter, the present invention will be described in detail.

We prepared a porous polyimide (PI) film through a non-solvent induced phase separation (NIPS) process and completed the present invention by confirming that a PI film having low dielectric property can be manufactured by controlling parameters such as polymer solution concentration and immersion time thereof.

The present invention provides a manufacturing method of a porous polyimide film using a thermodynamic phase separation process.

More specifically, provided is a manufacturing method of a porous polyimide film, the method comprising: preparing a polyamic acid solution by dissolving a diamine compound and a dianhydride in a solvent; applying the prepared polyamic acid solution to a substrate to prepare a film and then immersing the same in a non-solvent; and taking out the immersed film and thermally curing the same.

In the manufacturing method according to the present invention, the preparing a polyamic acid solution may be performed by dissolving a diamine compound and a dianhydride in a solvent.

The diamine compound may be at least one selected from the group consisting of 4,4'-oxydianiline (ODA), bis (4-aminophenyl) sulfide (ASD), and para-phenylenediamine (PDA), but is not limited thereto.

The dianhydride may be at least one selected from the group consisting of pyromellitic dianhydride (PMDA), biphenyl-tetracarboxylic acid dianhydride (BPDA), and oxydiphthalic anhydride (ODPA), but is not limited thereto.

The solvent is a substance capable of dissolving the diamine compound and the dianhydride and may be at least one selected from the group consisting of 1-methyl-2-pyrrolidinone (NMP), N, N-dimethylacetamide (DMAC), and N, N-dimethylformamide (DM F), but is not limited thereto.

A polymer solution such as polyamic acid may be prepared by the dissolution, and the polymer solution may be used as a polymer casting solution.

The polyamic acid solution may be prepared at a concentration of 10 to 30 wt %, preferably at a concentration of 15 to 20 wt %, but is not limited thereto.

According to the manufacturing method, the pore shape or pore size of the polyimide membrane, preferably both the pore shape and size, may be controlled by controlling the concentration of the polyamic acid solution.

According to an Experimental Example of the present invention, since the pore shape or pore size can be controlled by controlling the concentration of a polymer solution, a polymer solution at a concentration of 16 wt % or higher can form a sponge-type porous structure. Increasing the concentration of a polymer solution suppresses the formation of large and non-uniform pores and facilitates the formation of small and uniform pores. This is because the increased viscosity in a high-concentration polymer solution inhibits the diffusion and mass transfer between a solvent and a non-solvent during phase separation, thereby hindering the growth of nuclei that form macropores.

In the manufacturing method according to the present invention, the immersing in a non-solvent is performed by applying the prepared polyamic acid solution to a substrate to form a film and then immersing the film in a non-solvent. Pores may be formed as polyamic acid phase separation occurs through diffusion exchange between the solvent and the non-solvent. When a solution in which a polymer and a solvent is mixed is immersed in a non-solvent, the solvent escapes into the non-solvent and pores are formed where the solvent escapes from, because the polymer is insoluble in the non-solvent.

The non-solvent is a material that does not dissolve the film made of the polymer solution and may be selected from the group consisting of acetone, ethanol, ultrapure water, and a mixture thereof, but is not limited thereto.

The immersing may be performed for 30 minutes to 180 minutes.

In the manufacturing method, the pore shape or pore size of the polyimide film may be controlled by controlling the immersion time in the non-solvent.

According to an Experimental Example of the present invention, the pores n the surface may be controlled by controlling the immersion time of a polymer solution in a non-solvent. Significant porosity was not formed when the immersion time was less than 30 minutes, and when immersion was performed for 120 minutes, a sponge-type open-cell porous structure in which pores were interconnected was formed and no pores were formed on the surface. However, when immersion was performed for 180 minutes or longer, formation of interconnected pores was confirmed also on the surface.

In the manufacturing method according to the present invention, the thermally curing may be performed by taking out the immersed film and thermally treating the same.

More specifically, the immersed film is taken out and heated at 80 to 100° C. under vacuum conditions for 1 to 3 hours, and then, on a hot plate that is heated to 80 to 100° C., heated at a temperature of 140 to 160° C. for 1 to 2 hours, 190 to 210° C. for 1 to 2 hours, 240 to 260° C. for 30 minutes to 1 hour, and 290 to 310° C. for 30 minutes to 1 hour to cure, but is not limited thereto.

In the manufacturing method according to the present invention, the manufacturing method further comprises preparing a surface-modified porous inorganic filler before preparing the polyamic acid solution, wherein the prepared porous inorganic filler may be added to the polyamic acid solution to prepare a polyamic acid solution to which a porous inorganic filler is added.

The porous inorganic filler may be surface-modified with at least one selected from the group consisting of $NH_2$, OH, and SH.

The porous inorganic filler may be at least one selected from the group consisting of mesoporous silica of MCM-41 or MCM-48; polyhedral oligomeric silsesquioxane (POSS); and zeolite of zeolite X or zeolite Y, but is not limited thereto.

The porous inorganic filler may be included in an amount of 1 to 20 parts by weight based on a total of 100 parts by weight of the polyamic acid solution, but is not limited thereto.

As the surface-modified porous inorganic filler may have an excellent dispersibility in a matrix by forming a covalent bond with polyimide, and may form a hierarchical porous structure in which mesoporous and macroporous structures exist together. The synergic effect of this hierarchical porous structure and the porous inorganic filler having a low dielectric constant can exhibit low dielectric constant and low dielectric loss properties superior to conventional insulators.

The present invention provides a manufacturing method of a porous polyimide film, the method comprising: preparing a surface-modified porous inorganic filler; preparing a polyamic acid solution by dissolving a diamine compound and a dianhydride in a solvent, and adding the surface-modified porous inorganic filler to the prepared solution; applying the polyamic acid solution to which the surface-modified porous inorganic filler is added to a substrate to prepare a film and then immersing the same in a non-solvent; and taking out the immersed film and thermally curing the same.

In the manufacturing method according to the present invention, the preparing the surface-modified porous inorganic filler may be performed by modifying the surface of a porous inorganic filler with a functional group.

The porous inorganic filler may be surface-modified with at least one selected from the group consisting of $NH_2$, OH, and SH.

The porous inorganic filler may be at least one selected from the group consisting of mesoporous silica of MCM-41 or MCM-48; polyhedral oligomeric silsesquioxane (POSS); and zeolite of zeolite X or zeolite Y, but is not limited thereto.

In the manufacturing method according to the present invention, the adding the surface-modified porous inorganic filler may be performed by preparing a polyamic acid solution by dissolving a diamine compound and a dianhydride in a solvent, and then adding the surface-modified porous inorganic filler to the prepared solution.

The porous inorganic filler may be included in an amount of 1 to 20 parts by weight based on a total of 100 parts by weight of the polyamic acid solution, but is not limited thereto.

Subsequent steps and corresponding features may be substituted in the portions described above.

The present invention provides a porous polyimide film prepared according to the manufacturing method above.

The porous polyimide film may have pores having an average diameter of 10 μm to 30 μm.

The porous polyimide film may form a hierarchical porous structure and thus have low dielectric property. As described above, the porous polyimide film may have improved low dielectric property by a hierarchical porous structure in which both mesoporous and macroporous structures exist.

In addition, the porous polyimide film may have improved thermal stability.

According to an Experimental Example of the present invention, the porous polyimide film has a dielectric constant of 2 or less (1.99 at 30 MHz) in a wide frequency range of 100 Hz-30 MHZ, and a $T_{d5}$% value of 576° C. or higher, and a $T_g$ of 391° C. or higher, due to the excellent low dielectric property and thermal stability, the porous polyimide film can be used as an insulating material for high-frequency or a battery separator. For example, the porous polyimide film can be usefully applied as internal insulators for, for example, electronic devices, circuit boards, protective materials for liquid crystal display devices, and so on.

In addition, the present invention provides an insulating material for high frequency comprising a porous polyimide prepared according to the manufacturing method.

Hereinafter, Examples will be described in detail to help the understanding of the present invention. However, the following Examples are merely illustrative of the contents of the present invention, but the scope of the present invention is not limited to the following Examples. The Examples of the present invention are provided to more completely explain the present invention to those skilled in the art.

<Example 1> Preparation of Insulating Film Made of a Porous Film by Using Nonsolvent-Induced Phase Separation (NIPS)

1-1. Experimental Materials

Pyromellitic dianhydride (PMDA, >98%) and 4,4'-oxydianiline (ODA, >98%) were purchased from Tokyo Chemical Industry, Co., Ltd. (Tokyo, Japan). 1-Methyl-2-pyrrolidinone (NMP, >99%) and acetone (>99%) were purchased from Duksan Chemical Co., Ltd. (Ansan, Korea). All chemicals were used without further purification.

1-2. Preparation of Porous Polyimide 0.60 g (3 mmol) of 4,4'-oxydianiline (ODA) and 2.02 g of N-methyl-2-pyrrolidone (NMP) were put into a flask and stirred. After ODA was completely dissolved, 0.65 g (3 mmol) of pyromellitic dianhydride (PMDA) and 3.00 g of NMP were further added and stirred for 24 hours to prepare a polyamic acid (PAA) solution. The PAA solution, from which bubbles were removed, was made into a film form on a slide glass through a casting process, and then immersed in 50 mL of prepared acetone for 2 hours. The immersed film was taken out and put in an oven and heated at 90° C. for 2 hours under vacuum conditions. After taking out the heated film and placing the same on a hot plate heated to 90° C., a glass funnel was placed on the film and the temperature was raised to 150° C. to heat the film for 1 hour and 5 minutes. Thereafter, the film was heated at 200° C. for 1 hour and 5 minutes, at 250° C. for 35 minutes, and at 300° C. for 35 minutes to cure and completely evaporating the remaining solvent. After cooling at room temperature, immersing in distilled water for 24 hours, detaching from the slide glass, and drying in an oven at 80° C. for 24 hours, a uniform porous polyimide was completed (FIG. 1).

Referring to FIG. 1, a homogeneous PAA/NMP composite solution was bar-coated on a glass substrate, and then a PAA film was immersed during solvent-non-solvent exchange under a chemical potential gradient. The polymer-rich phase formed a film matrix, while the dispersible non-solvent-rich phase formed 3D interconnected micropores. Finally, the solidified porous PAA film was thermally cured at 300° C., as amic acid group was completely converted into imide.

1-3. Preparation of Composite Material of Porous Polyimide and Porous Silica

The surface of MCM-41 or MCM-48, which is mesoporous silica, was functionalized with a $NH_2$ group to synthesize fillers to be used in a composite material. Specifically, 2.4 g of cetyltrimethylammonium bromide (CTAB), which is a surfactant, was dissolved in 120 mL of water at room temperature. 8 mL of a 32% aqueous ammonia solution and 10 mL of tetraethylorthosilicate (TEOS) were added to the solution, and the resulting mixture was stirred for 1 hour. A product in powder form was filtered, washed with distilled water several times to remove CTAB, and then dried at 110° C. for 24 hours to obtain MCM-41 powder. 2 g of the synthesized MCM-41 was placed in a flask, and 60 mL of toluene was added, and the resulting mixture was stirred and dispersed at 60° C. for 1 hour. 4 mL of aminopropyl triethoxy silane (APTES) was added, and the resulting mixture was stirred at 60° C. for 2 hours, filtered, washed with toluene, and dried at 60° C. for 24 hours to synthesize $NH_2$ group-functionalized MCM-41.

$NH_2$-functionalized MCM-41 or MCM-48 strongly interacts with polyimide monomers, and thus can be prepared as a composite material having a stable interface. After dissolving a diamine and a dianhydride in a solvent, the synthesized filler was added to the resulting solution in an amount of 1 wt % (0.0126 g), 3 wt % (0.0387 g), 5 wt % (0.0658 g), and 10 wt % (0.1389 g) based on the mass of the monomers, and the resulting mixture was sonicated for more than 10 minutes and then stirred for 24 hours. After that, casting, NIPS, and thermal curing processes were carried out in the same manner as the porous polyimide preparation process of Example 1-2.

<Experimental Method>

Scanning electron microscopy (SEM) was performed by using a Hitachi SU8220 instrument at an accelerating voltage of 10 kV. Dielectric property was measured with an Agilent (Santa Clara, CA, USA) 4294A Precision Impedance analyzer on samples mounted between parallel plate electrodes in a 16451B dielectric test device. Complying with the ASTM D150 standard, the 16451B has three electrodes: two forming a capacitor and one providing a protective electrode to suppress the effects of 'fringe capacitance' and provide accurate measurement. The test device was kept in a microprocessor-controlled oven to keep the temperature of the sample constant during the measurement. The dielectric constant was calculated according to Equation 1 below:

$$\varepsilon' = \frac{C_m}{\varepsilon_0}\frac{t}{A} = \frac{C_m \times t}{\varepsilon_0 \times \pi \times (d/2)^2} \quad \langle\text{Equation 1}\rangle$$

In the formula above, a' is the dielectric constant, co is the vacuum permittivity ($8.85\times10^{-12}$ $Fm^{-1}$), Cm is the measured capacitance, A is the electrode area, d is the electrode diameter, and t is the film thickness.

<Experimental Results>

1. Confirmation of Properties of Prepared Porous Polyimide Film 1-1. Confirmation of Pore Properties of Polyimide Film Depending on the Polymer Solution Concentration The shape of the PPI film obtained by NIPS reflects the thermodynamics and phase separation kinetics of the polymer diluent solution. Depending on the change of the polymer concentration of the casting solution and the non-solvent immersion time, the porous structure of the manufactured PPI film can be easily controlled. The structure of the PPI film was confirmed by XRD patterns and SEM micrographs.

Figure 2:
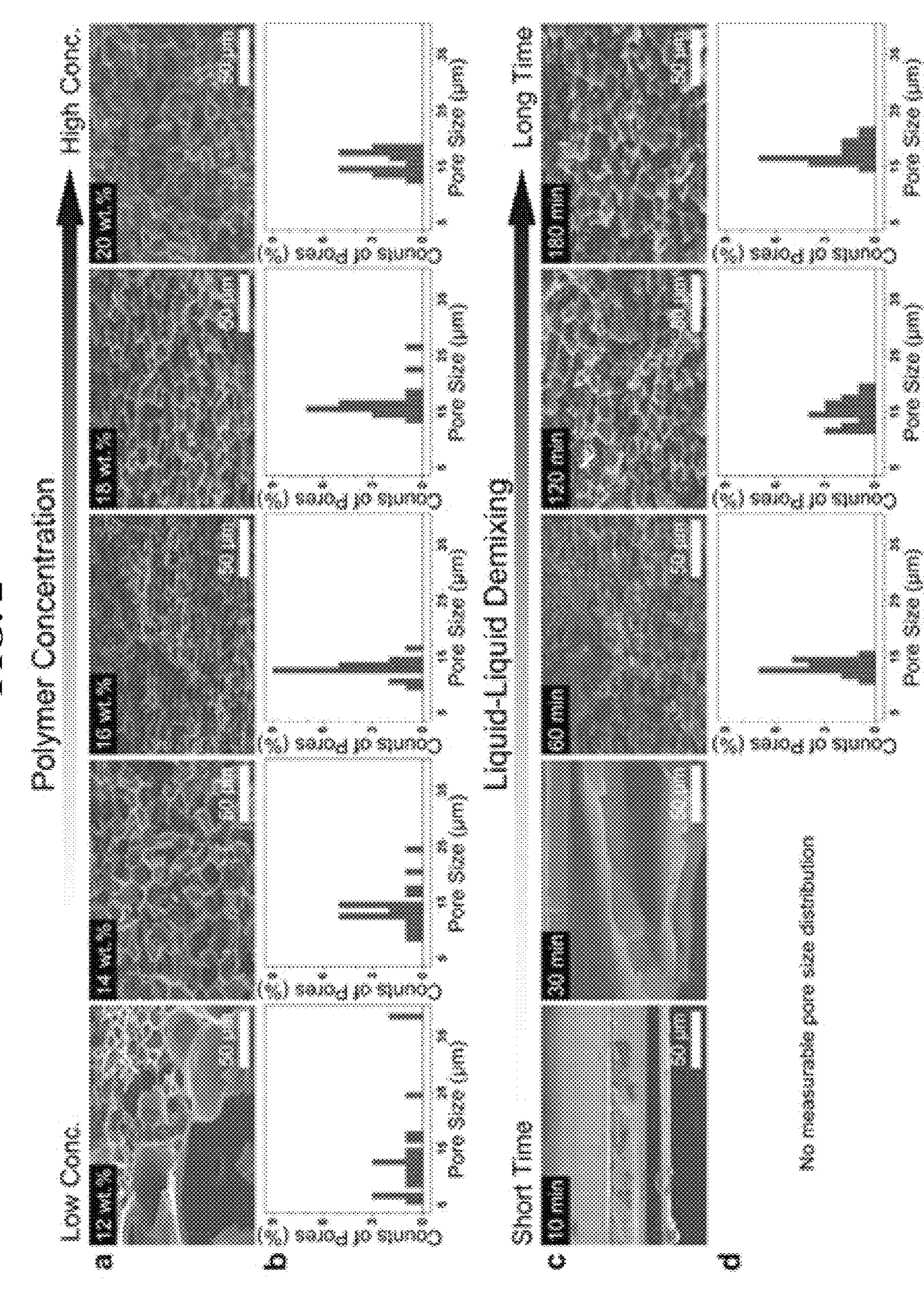
FIG. 2 shows the scanning electron microscope (SEM) fracture surface morphology and pore size distribution of PI and PPI films under various conditions, wherein a and b show the results obtained by varying the polymer concentrations and (c) and (d) show the results obtained by varying the coagulation time.

FIG. 2*a* shows the fracture surface of PPI films prepared by using NMP as a solvent having various PAA concentrations from 12 to 20 wt %. Referring to FIG. 2*b*, it is observed that an increase in PAA concentration inhibits the formation of numerous macropores, and thus promoting a sponge-like porous structure. At PAA concentrations equal to or higher than 16 wt % and equal to or lower than 30 wt %, a sponge-like porous structure predominates, in contrast to the structures obtained at relatively low concentrations. The enhanced viscosity at a high polymer concentration hinders the growth of nuclei causing the development of macropores, due to inhibition of diffusion exchange and mass transfer between the solvent and non-solvent during phase inversion. At PAA concentrations above 30 wt %, processing is difficult due to excessively increased viscosity.

1-2. Confirmation of Pore Properties of Polyimide Film Depending on Non-Solvent Immersion Time The non-solvent immersion time (liquid-liquid demixing time) is another factor contributing to the structural transition. FIG. 2*c* shows the fracture surfaces of the PPI films prepared at the same PAA concentration of 20 wt % as a function of coagulation time. About 120 min was taken to develop a sponge-like porous structure in the PI film without large air voids. However, at a coagulation time of 30 minutes or less, the phase non-uniformity was insufficient to form a porous structure, and so large cracks were observed at the fracture surface.

Figure 3:
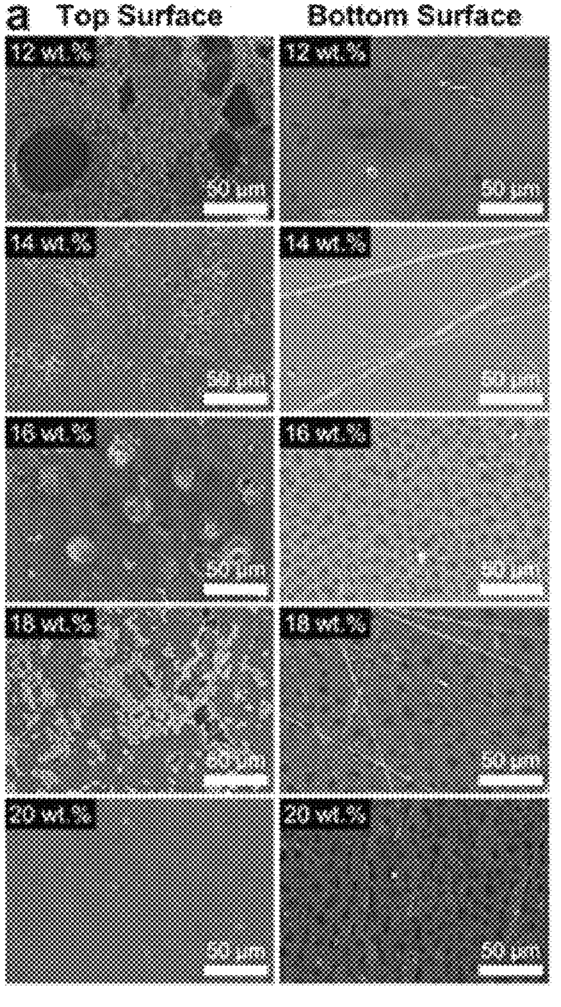
FIG. 3 shows the form of PI and PPI films under various conditions, wherein (a) shows SEM images according to the polymer concentration and (b) shows SEM images according to the coagulation time.
Figure 3:
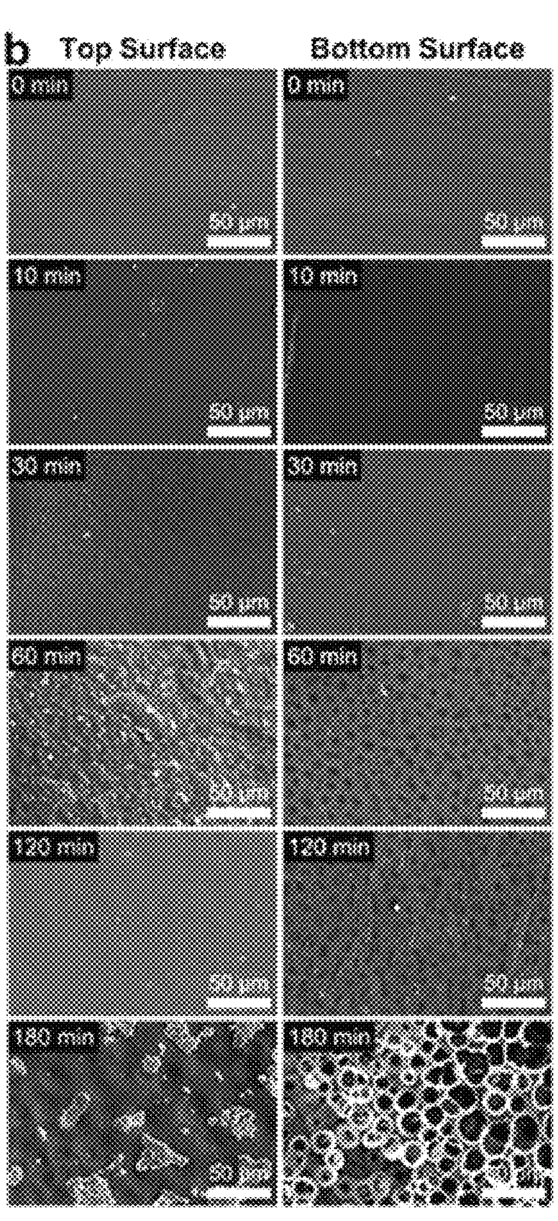

Referring to FIG. 3, a PPI film prepared at a concentration of 20 wt % PAA for 120 minutes included a closed cell surface layer. This observation is consistent with the hypothesis that a rapid phase inversion occurs on the outer surface when the PAA solution is directly immersed in a non-solvent. Therefore, PAA aggregations affecting the formation of a dense surface were detected. A dense layer without pores was formed on the bottom surface, but after 180 minutes of immersion, interconnected open cell pores were formed on the bottom surface due to excessive solvent leaching from the PAA film.

1-3. Confirmation of Dielectric Properties of Polyimide Film

Figure 4:
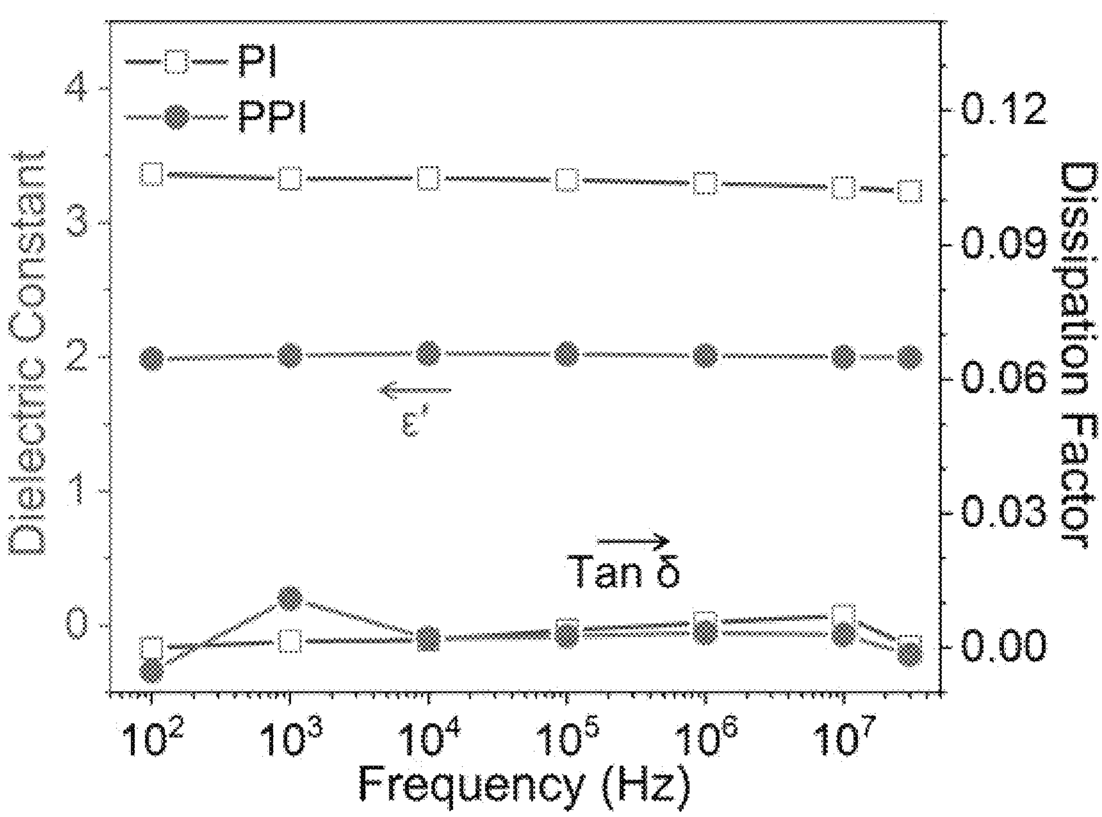
FIG. 4 shows the dielectric constant and dielectric loss of non-porous PI and PPI films in the frequency range of 100 Hz to 30 MHz.

The dielectric properties were evaluated in a frequency range from 100 Hz to 30 MHz at room temperature by using a broadband dielectric spectrometer, and referring to FIG. 4 and Table 1, the results showed that the dielectric constant (¿') had weak dependence over a wide frequency range. The dielectric constant of the non-porous PI film was 3.29 and 3.23 at 1 and 30 MHZ, respectively, whereas the PPI film showed significantly lower dielectric constants in all frequency ranges. In particular, the PPI film showed ultra-low dielectric constants of 2.0 and 1.99 at 1 and 30 MHz, respectively. This was because the presence of the hierarchical porous structure in the PPI film can introduce air voids with an extremely low k value of ~1.0. In addition, the dielectric loss of the PPI film was obviously reduced in the high frequency range. Therefore, the dielectric performance of the produced PPI film can be stable in a wide frequency range from 100 Hz to 30 MHz.

Table 1 below shows the thermal and dielectric properties of non-porous PI and PPI films.

TABLE 1

| Sample | $T_g$ (° C.) | $T_{d5\%}$ (° C.) | $T_{d10\%}$ (° C.) | Char residue at 800° C. | Dielectric Constant at 1 MHz | Dielectric loss at 1 MHz |
|---|---|---|---|---|---|---|
| PI | 381 | 564 | 589 | 57.47 | 3.29 | 5.60 |
| PPI | 392 | 577 | 596 | 53.56 | 2.01 | 3.34 |

Figure 5:
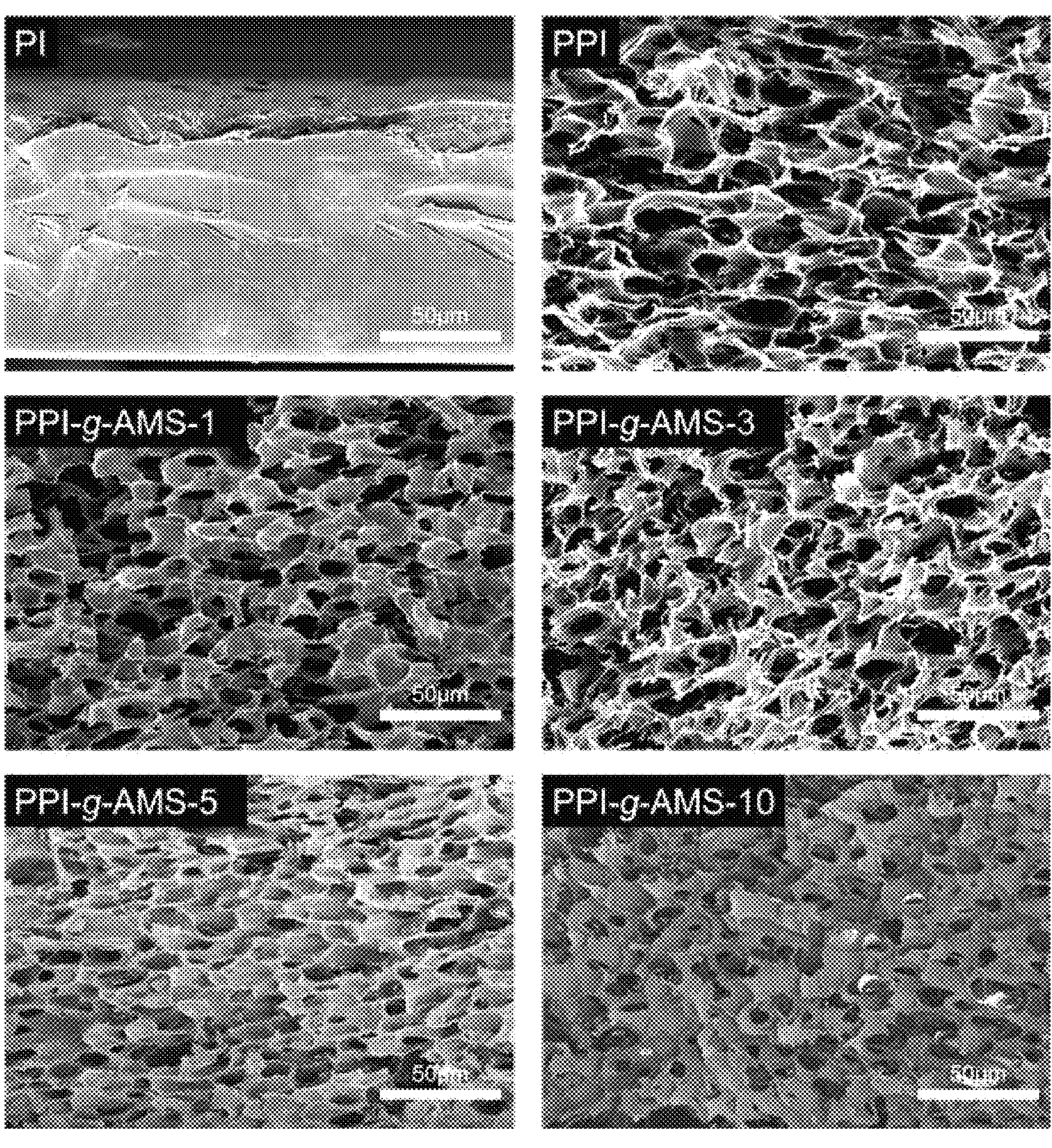
FIG. 5 shows SEM images of PI, PPI and PPI-g-AMS composite prepared by adding porous silica MCM-41.

2. Confirmation of Properties of Prepared Porous Polyimide Composite 2-1. Confirmation of Pore Properties of Polyimide Composite To check whether the polyimide composite material (PPI-g-AMS) prepared with porous silica MCM-41 formed porosity, SEM images of the cross-section of the film were taken, and the results showed as in FIG. 5 that the untreated polyimide (PI) samples exhibited no porosity, but porous polyimide composite (PPI) samples exhibited uniform porosity. PPI is an abbreviation for porous polyimide, PPI-g-AMS refers to a composite material of PPI and an amine doped mesoporous silica (AMS), and the number that follows means the wt % of the filler.

Figure 6:
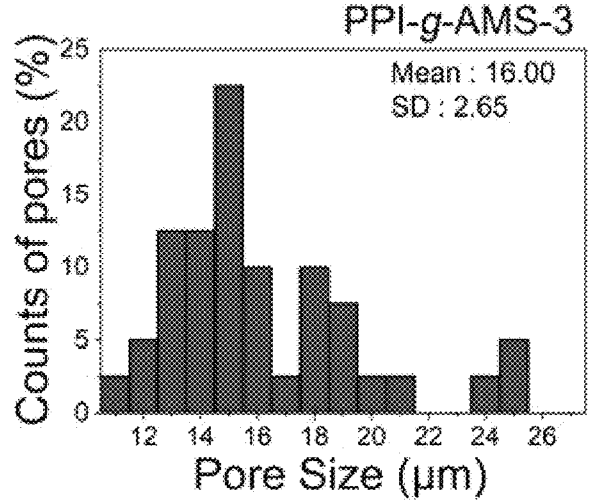
FIG. 6 shows the pore size measurement results of the PI, PPI and PPI-g-AMS composite.
Figure 6:
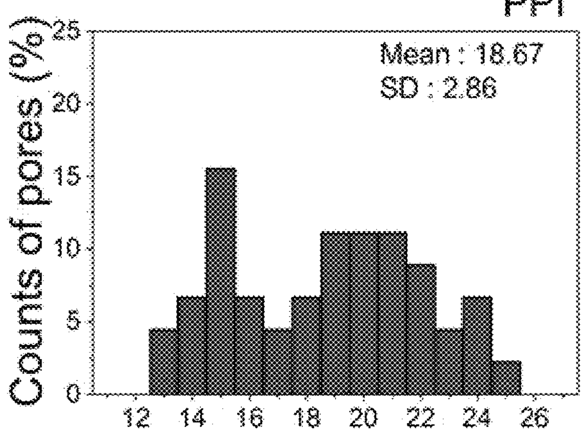
Figure 6:
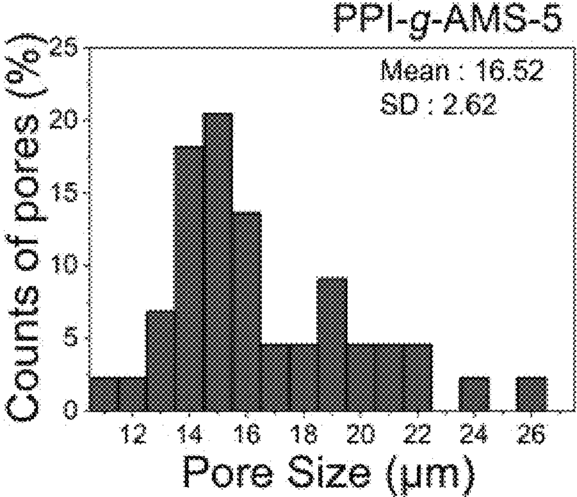
Figure 6:
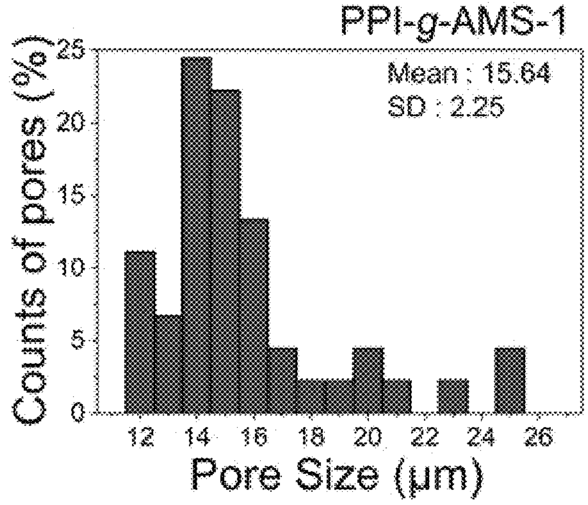
Figure 6:
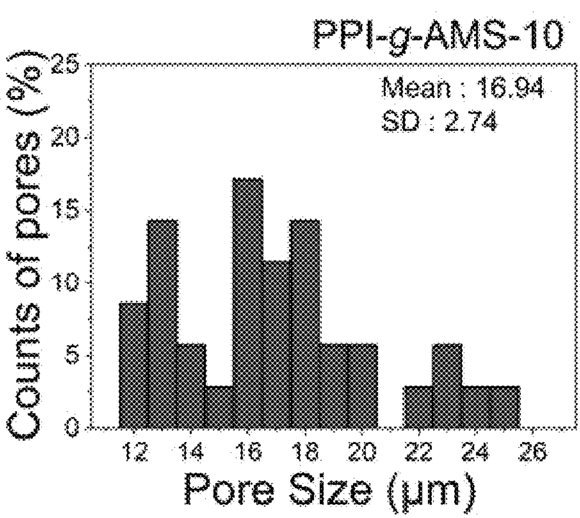

The size of the pores was measured, and as shown in FIG. 6 and Table 2, each sample exhibited a uniform pore size.

Table 2 shows the measured pore size of the PPI and PPI-g-AMS samples.

TABLE 2

| | Sample | | | | |
|---|---|---|---|---|---|
| | PPI | PPI-g-AMS-1 | PPI-g-AMS-3 | PPI-g-AMS-5 | PPI-g-AMS-10 |
| Mean pore size | 18.67 | 15.64 | 16 | 16.52 | 16.94 |
| Standard deviation | 2.86 | 2.25 | 2.65 | 2.62 | 2.74 |

2-2. Confirmation of Dielectric Properties of Porous Polyimide Composite

Figure 7:
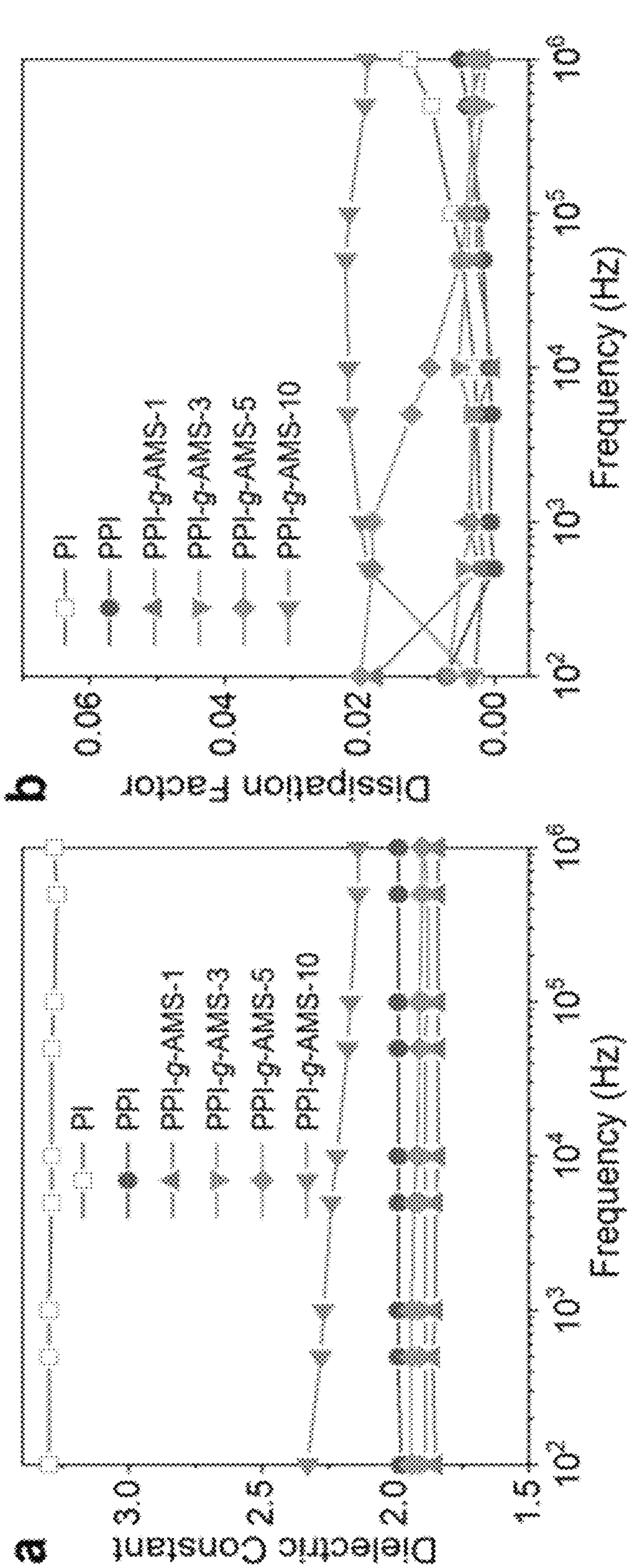
FIG. 7 shows (a) the dielectric constant and (b) dielectric loss measurement results of the PI, PPI and PPI-g-AMS composite.

KEYSIGHT E4980A was used to measure the dielectric constant of all the six samples up to the voltage condition of 1V and 1 MHz range, and the results in FIG. 7*a* and Table 3 below showed that the PI sample showed a dielectric constant of 3.28 at 1 MHz, while all the PPI and PPI-g-AMS samples, which went through the NIPS process, exhibited a dielectric constant of 1.84 to 2.14 at 1 MHz, which were much lower than that of PI. In particular, the PPI-g-AMS-1 sample exhibited the lowest dielectric constant.

In addition, the values of the dielectric loss were measured, and the results in FIG. 7*b* and Table 3 below showed that the PI sample showed a dielectric loss value of 0.0127 at 1 MHZ, while all the PPI and PPI-g-AMS samples, which went through the NIPS process, exhibited dielectric loss values at 1 MHz that were much lower than that of PI. In particular, it was confirmed that the PPI-g-AMS-1 sample and the PPI-g-AMS-3 sample exhibited dielectric loss values of 0.0018 and 0.0015, respectively, which were considerably lower. However, the dielectric loss value of the PPI-g-AMS-10 sample was 0.0189, which was a relatively high dielectric loss value, due to the increase of the interfacial polarization.

Table 3 below shows the measurements of the dielectric constant ($D_k$) and the dielectric loss value ($D_f$) of the PI, PPI and PPI-g-AMS samples.

TABLE 3

| | Sample | | | | | |
|---|---|---|---|---|---|---|
| | PI | PPI | PPI-g-AMS-1 | PPI-g-AMS-3 | PPI-g-AMS-5 | PPI-g-AMS-10 |
| $D_k$ | 3.28 | 1.99 | 1.84 | 1.89 | 1.9 | 2.14 |
| $D_f$ | 0.0127 | 0.0052 | 0.0018 | 0.0015 | 0.0032 | 0.0189 |

Figure 8:
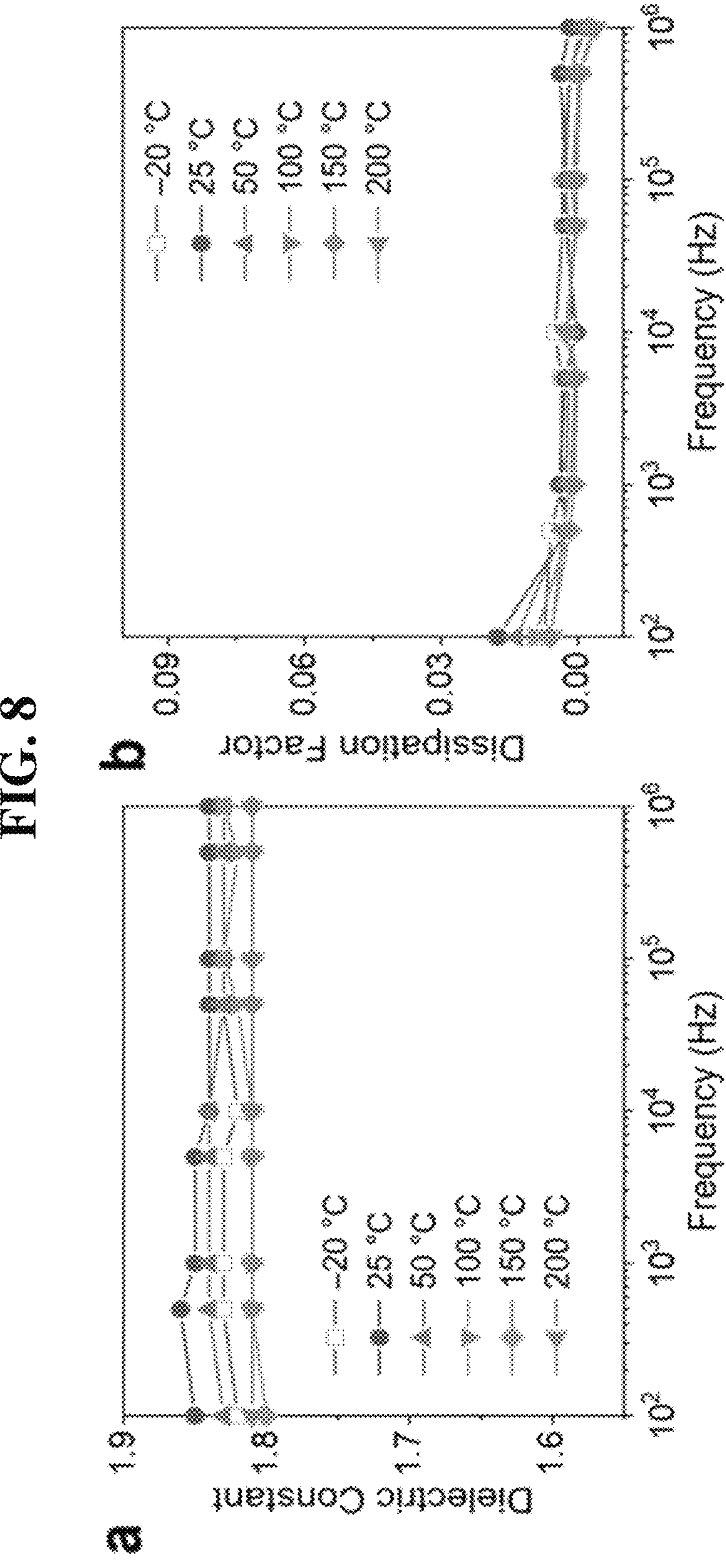
FIG. 8 shows the (a) the dielectric constant and (b) dielectric loss measurement results of the PPI-g-AMS-1 composite according to the temperature.

2-3. Confirmation of Dielectric Characteristics of Porous Polyimide Composite Depending on Temperature KEYSIGHT E4980A was used to measure the dielectric constant according to the temperature of the PPI-g-AMS-1 sample for each temperature of −20° C., 25° C., 50° C., 100° C., 150° C., and 200° C. up to the voltage condition of 1 V and 1 MHz range, and as shown in FIG. 8*a* and Table 4 below, the highest permittivity was found at room temperature and the permittivity was decreased when the temperature was raised or lowered from room temperature. However, since the permittivity showed almost no change according to the temperature, it was confirmed that an excellent insulating material can be manufactured.

In addition, the values of the dielectric loss were measured according to temperature, and as shown in FIG. 8*b* and Table 4 below, all the sample exhibited a low dielectric loss value close to zero.

Table 4 below shows the measurements of the dielectric constant ($D_k$) and the dielectric loss value ($D_f$) of the PPI-g-AMS-1 sample.

TABLE 4

| | Temperature (° C.) | | | | | |
|---|---|---|---|---|---|---|
| | −20 | 25 | 50 | 100 | 150 | 200 |
| $D_k$ | 1.83 | 1.84 | 1.83 | 1.83 | 1.81 | 1.81 |
| $D_f$ | 0.0018 | 0.0018 | 0.0008 | 0.0032 | 0.0031 | 0.004 |

Figure 9:
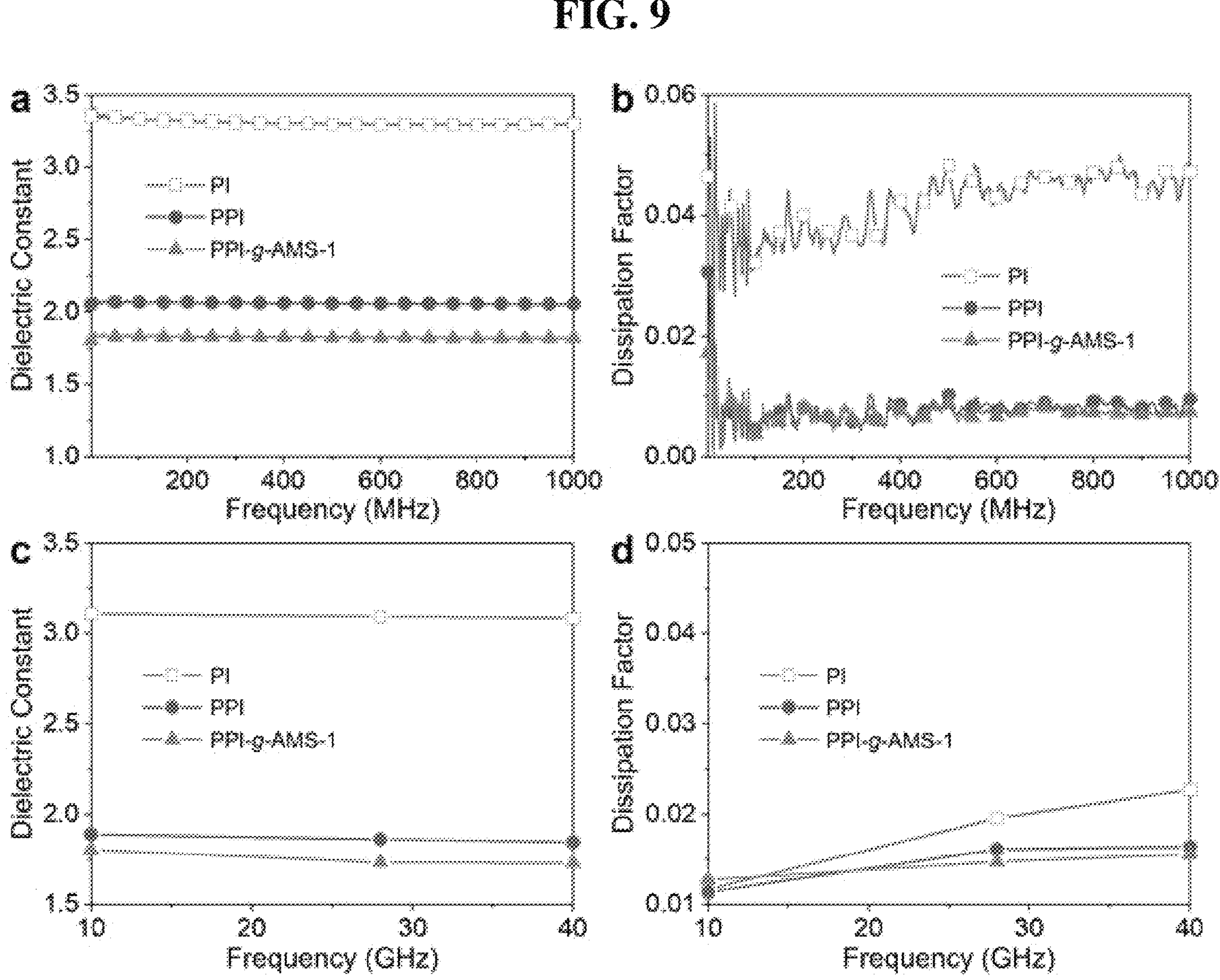
FIG. 9 shows (a), (c) the dielectric constant and (b), (d) dielectric loss measurement results of the PI, PPI and PPI-g-AMS composite in a high-frequency range.

2-4. Confirmation of Dielectric Characteristics of Porous Polyimide Composite in High-Frequency Range KEYSIGHT E4980A was used to measure the dielectric constant of all the PI, PPI, and PPI-g-AMS-1 samples under the voltage condition of 1 V in a wide high-frequency range from 1 MHZ to 40 GHz, and as shown in FIGS. 9*a* and 9*c* and Table 5 below, the PI exhibited a dielectric constant of 3.09 and 3.08 at 28 GHz and 40 GHz, respectively, the PPI and the PPI-g-AMS-1 samples exhibited dielectric constants in the high-frequency range that were much lower than that of the PI. In particular, the PPI-g-AMS-1 sample exhibited a dielectric constant of 1.73 at 28 GHz and 40 Hz, which was the lowest dielectric constant. In addition, when the frequency was increased from 1 MHz to 40 GHz, the dielectric constant of the PPI-g-AMS-1 sample remained almost constant.

In addition, the values of the dielectric loss were measured, and the results in FIGS. 9*b* and 9*d* and Table 5 below showed that the dielectric loss value of the PPI-g-AMS-1 sample was slightly increased from 0.0018 to 0.0156.

The results described above confirmed that the permittivity exhibited almost no change even in the high-frequency range and showed a stably low permittivity, indicating that a material with excellent insulation can be manufactured.

Table 5 below shows the measurements of the dielectric constant ($D_k$) and the dielectric loss value ($D_f$) of the PI, PPI, and PPI-g-AMS-1 samples.

TABLE 5

| | $D_k$ | | | $D_f$ | | |
|---|---|---|---|---|---|---|
| Sample | 10 GHz | 28 GHz | 40 GHz | 10 GHz | 28 GHz | 40 GHz |
| PI | 3.11 | 3.09 | 3.08 | 0.0117 | 0.0196 | 0.0227 |
| PPI | 1.89 | 1.86 | 1.85 | 0.0114 | 0.0161 | 0.0147 |
| PPI-g-AMS-1 | 1.80 | 1.73 | 1.73 | 0.0227 | 0.0163 | 0.0156 |

So far, specifical Examples of the present invention have been described. Those of ordinary skill in the art to which the present invention pertains will understand that the present invention can be implemented in a modified form without departing from the essential characteristics of the present invention. Therefore, the disclosed Examples should be considered from an illustrative point of view rather than a limiting point of view. The scope of the present invention is shown in the claims rather than the foregoing description, and all differences within the equivalent scope will be construed as being included in the present invention.

What is claimed is:

1. A manufacturing method of a porous polyimide film, the method comprising: preparing a polyamic acid solution at a concentration of 10 to 30 wt % by dissolving a diamine compound and a dianhydride in a solvent and adding a porous inorganic filler;

applying the prepared polyamic acid solution to a substrate to prepare a film and then immersing the same in a non-solvent for 30 minutes to 180 minutes; and taking out the immersed film and thermally curing the same, wherein the porous inorganic filler is selected from the group consisting of mesoporous silica of MCM-41 or MCM-48; polyhedral oligomeric silsesquioxane (POSS); and zeolite of zeolite X or zeolite Y.

2. The manufacturing method of a porous polyimide film according to claim 1, wherein the porous inorganic filler is a surface-modified porous inorganic filler.

3. A porous polyimide film prepared by the method according to claim 1.

4. The porous polyimide film according to claim 3, wherein the porous polyimide film has pores having an average diameter of 10 to 30 μm.

5. The porous polyimide film according to claim 3, wherein the porous polyimide film forms a hierarchical porous structure.

6. An insulating material for high frequency, comprising the porous polyimide film according to claim 3.

7. A method for preparing a porous polyimide film, the method comprising:

preparing a surface-modified porous inorganic filler;

preparing a polyamic acid solution by dissolving a diamine compound and a dianhydride in a solvent and adding the surface-modified porous inorganic filler to the prepared solution;

applying the polyamic acid solution to which the surface-modified porous inorganic filler is added to a substrate to prepare a film and then immersing the same in a non-solvent; and taking out the immersed film and thermally curing the same, wherein the porous inorganic filler is selected from the group consisting of mesoporous silica of MCM-41 or MCM-48; polyhedral oligomeric silsesquioxane (POSS); and zeolite of zeolite X or zeolite Y.

8. The method for preparing a porous polyimide film according to claim 7, wherein the porous inorganic filler is surface-modified with at least one selected from the group consisting of $NH_2$, OH, and SH.

9. The method for preparing a porous polyimide film according to claim 7, wherein the porous inorganic filler is included in an amount of 1 to 20 parts by weight based on a total of 100 parts by weight of the polyamic acid solution.

10. The method for preparing a porous polyimide film according to claim 7, wherein the polyamic acid solution has a concentration of 10 to 30 wt %.

11. The method for preparing a porous polyimide film according to claim 7, wherein immersing in a non-solvent is performed for 30 to 180 minutes.

12. A porous polyimide film prepared by the method according to claim 7.

13. The porous polyimide film according to claim 12, wherein the porous polyimide film has pores having an average diameter of 10 to 30 μm.

14. The porous polyimide film according to claim 12, wherein the porous polyimide film forms a hierarchical porous structure.

15. An insulating material for high frequency, comprising the porous polyimide film according to claim 12.

* * * * *